United States Patent [19]

Quinn

[11] Patent Number: 5,784,258
[45] Date of Patent: Jul. 21, 1998

[54] WIRING BOARD FOR SUPPORTING AN ARRAY OF IMAGING CHIPS

[75] Inventor: Kraig A. Quinn, Webster, N.Y.

[73] Assignee: Xerox Corporation, Stamford, Conn.

[21] Appl. No.: 840,210

[22] Filed: Apr. 11, 1997

[51] Int. Cl.⁶ .................................................. H05K 3/30
[52] U.S. Cl. ........................ 361/748; 361/777; 174/255; 174/260; 29/743
[58] Field of Search ............................ 361/719, 720, 361/748, 749, 760, 777, 779; 174/250, 254, 255; 257/700, 723, 724, 911; 29/743; 347/130, 238

[56] References Cited

U.S. PATENT DOCUMENTS

| | | | |
|---|---|---|---|
| 3,149,266 | 9/1964 | Lipton | 174/255 |
| 4,363,930 | 12/1982 | Hoffman | 174/255 |
| 5,311,059 | 5/1994 | Banerji et al. | 257/778 |
| 5,325,267 | 6/1994 | Ewing | 174/255 |
| 5,329,067 | 7/1994 | Abe et al. | 174/255 |
| 5,481,438 | 1/1996 | Nemoto | 174/255 |
| 5,502,287 | 3/1996 | Nguyen | 174/255 |
| 5,528,272 | 6/1996 | Quinn et al. | 347/42 |
| 5,544,017 | 8/1996 | Beilin et al. | 174/255 |
| 5,545,913 | 8/1996 | Quinn et al. | 257/443 |
| 5,546,654 | 8/1996 | Wojnarowski et al. | 29/743 |
| 5,670,749 | 9/1997 | Wieloch et al. | 174/255 |

*Primary Examiner*—Leo P. Picard
*Assistant Examiner*—John B. Vigushin
*Attorney, Agent, or Firm*—R. Hutter

[57] ABSTRACT

A printed wiring board includes features which allow the board to be held firmly in place by a vacuum mounting device so that semiconductor chips can be placed thereon, and wire bonds established between the semiconductor chips and the circuitry on the board. The side of the board opposite the side having the semiconductor chips defines a ridge which encloses a portion of the surface area thereof. The ridge forms a gasket around a vacuum slot on the vacuum mounting device. The ridge also provides a firm surface for wirebonds to be ultrasonically welded to landings on the board.

14 Claims, 1 Drawing Sheet

WIRING BOARD FOR SUPPORTING AN ARRAY OF IMAGING CHIPS

FIELD OF THE INVENTION

The present invention relates to an assembly of semiconductor chips which would be used, for example, in an imaging device such as a linear array of photosensors, a linear array of light-emitting diodes, or portions of ink-jet ejectors. In particular, the present invention relates to a design of a printed wiring board which is useful in providing a firm support for ultrasonic welding of wire bonds to semiconductor chips in an array.

BACKGROUND OF THE INVENTION

In a full-page-width imaging device, such as an input scanner having a long array of photosensors, or an ink-jet printer having a long array of ejectors, the imaging devices are typically disposed over a plurality of semiconductor chips. The semiconductor chips are then arranged in a page-width array, typically up to thirteen inches long.

A currently-preferred design for creating a long linear array of photosensors is to provide a set of relatively small semiconductor chips, each semiconductor chip defining a linear array of photosensors along with ancillary circuit devices. These chips are typically approximately ¾ inches in length; in order to create a practical full page-width array, as many as 20 or more of these chips are abutted end-to-end to form a single linear array of photosensors. The abutted chips are mounted on a support platform in the form of a printed wiring board. The printed wiring board also includes circuitry which accesses the circuit devices on the individual chips. The interconnections between the relatively large-scale conductors on the printed wiring board and the relatively small contact paths on each semiconductor chip are preferably created by wire bonds which are ultrasonically welded to both the wiring board conductors and to the contact pads on the chips. There thus exists a need for any feature which can assist the ultrasonic welding of wire bonds from a semiconductor chip on the printed wiring board.

DESCRIPTION OF THE PRIOR ART

U.S. Pat. No. 5,311,059 discloses a semiconductor device package comprising a substrate with a metallization pattern on one surface and a semiconductor device having an active surface and a grounded surface on opposed sides. The semiconductor device is attached with a metallization pattern with the active surface thereof facing the substrate. An electrically conductive material covers the exposed grounded surface of the semiconductor device to provide an electrical connection between the grounded surface of the semiconductor and the metallization pattern on the substrate.

U.S. Pat. No. 5,545,913 discloses an assembly in which semiconductor chips are mounted on a support substrate. The chips are attached by their back planes onto the substrate by an elongated bead of electrically conductive adhesive. In this design, the printed wiring board, which attaches to the contacts on the chips, is also attached to the support substrate, next to the array of chips.

U.S. Pat. No. 5,528,272 discloses another full-width imaging board in which both a printed wiring board and the array of chips are mounted on the same surface of a structural bar.

SUMMARY OF THE INVENTION

According to one aspect of the present invention, there is provided a board defining a first main side, a second main side, and a thickness therebetween, for supporting at least one semiconductor chip on the first main side thereof. The board comprises a ridge protruding from the second main side, the ridge defining an enclosed surface area on the second main side.

According to another aspect of the present invention, there is provided an assembly comprising a board defining a first main side, a second main side, and a thickness therebetween. At least one semiconductor chip is attached to the first main side of the board. A ridge protrudes from the second main side of the board, the ridge defining an enclosed surface area on the second main side. The enclosed surface area surrounds a location opposite said at least one semiconductor chip on the first main side.

According to another aspect of the present invention, there is provided a board defining a first main side, a second main side, and a thickness therebetween, for supporting at least one semiconductor chip on the first main side thereof. A ridge protrudes from the second main side. A landing is defined on the first main side, the landing accepting a wire bond, the landing disposed at a location directly opposite a portion of the ridge on the second main side.

DETAILED DESCRIPTION OF THE INVENTION

Figure 1:
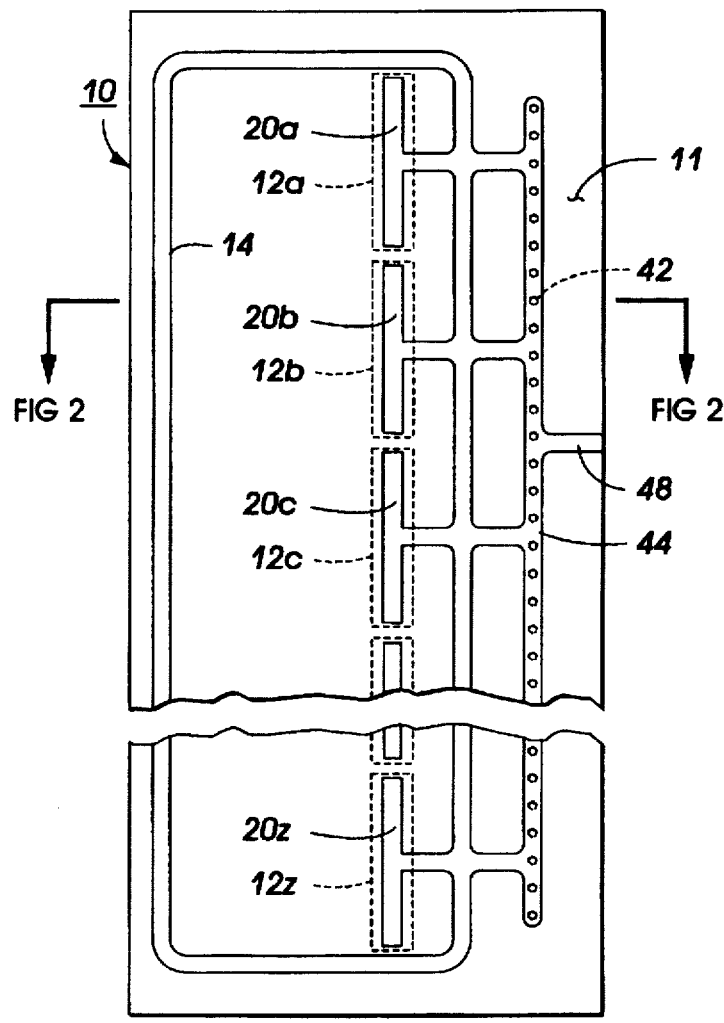
FIG. 1 is a plan view of one main side of a board or assembly according to the present invention.

FIG. 1 is a plan view of one main side of a printed wiring board, generally indicated as 10, incorporating the present invention. In the view of FIG. 1, solid lines indicate outlines of structures which are generally disposed on the surface 11 of the board facing the viewer, while structures in dashed lines represent the structures on the side of the board opposite the viewer.

The board 10 is a printed wiring board on which a plurality of semiconductor chips are mounted. In the view of FIG. 1, the semiconductor chips are mounted on the side opposite that presented to the viewer, and are thus shown in dashed lines and indicated as 12a, 12b, 12c, . . . 12z. The chips in this embodiment form a substantially contiguous array, as would be found, for example, in a photosensor or LED imaging bar.

According to the present invention, there is provided a structure in the form of a ridge protruding from the surface 11 of the board 10. According to one embodiment of the present invention, one type of ridge forms an enclosed area on the surface 11 of board 10. This ridge, forming a generally rectangular enclosed surface, is indicated as 14, and the ridge can be shown in two parts in the cross-sectional view of FIG. 2.

A portion of surface 11 enclosed by ridge 14 surrounds the locations corresponding to the locations of the chips 12a, 12b, . . . 12z on the opposite side of board 10. Further, the ridge 14 encloses a substantial blank area next to and alongside the areas corresponding to the locations of the chips.

The purpose of this particular configuration of ridge 14 relative to the locations of the chips on the opposite side is that the combination of the enclosed area of surface and the blank area facilitates placement of surface 11 of the board 10 against a vacuum mounting device. Such a mounting device is partially shown in phantom as V in the view of FIG. 2. In such a vacuum mounting device, a narrow slot from which vacuum suction (shown by the arrow S) is provided is generally disposed in the blank area within the area enclosed by ridge 14. The ridge 14 is thus urged against the top surface of the device V. Because ridge 14 encloses a portion of the surface area on side 11, the protrusion of ridge 14 provides a "gasket" effectively around the vacuum slot, substantially increasing the stability of the board 10 when it is on the vacuum mount.

Figure 2:
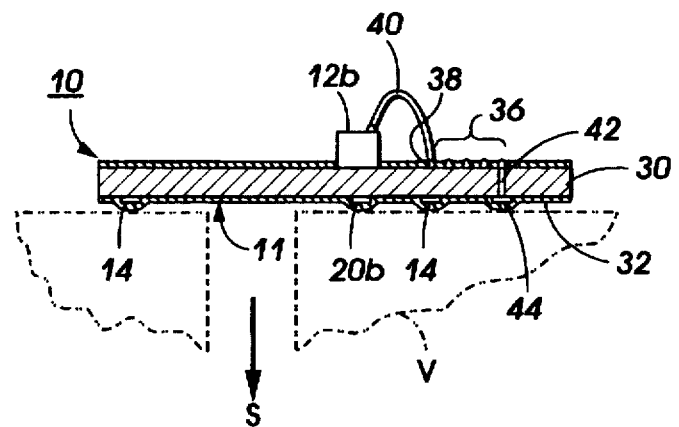
FIG. 2 is a cross-sectional view through line 2—2 in FIG. 1.

Also disposed within the area surrounded by ridge 14 are a series of what are here called "chip mount ridges" 20a, 20b, ... 20z, which are disposed in locations on side 11 opposite the locations of chips 12a, 12b, ... 12z on the opposite side of board 10. Thus, when the chip mount ridge 20b is placed on the vacuum mount V as shown in FIG. 2, the raised area of chip mount ridge 20b is urged rigidly against the flat surface in vacuum mount V adjacent the slot providing the suction force S. This structure provides a very secure surface, for example, when a pick-and-place robot system attaches the chip 12b onto the board 10 and ultrasonically-welded wire bonds are made from the board 10 to a chip such as 12b.

The basic structure of wiring board 10 is that of any common off-the-shelf wiring board currently available. As such, a board 10 typically includes a central non-conductive core here indicated as 30, typically comprising a porous ceramic; preferred materials include the wiring board material currently marketed by the manufacturer Ibiden. With reference to surface 11 of board 10, there is typically etched onto the main side of core 30 a metallization layer, usually made of copper. The ridges forming ridge 14 and chip mounting ridges 20a, 20b, ... are preferably formed within this metallization layer, i.e., areas on side 11 not contributing to these ridges are etched away from the metallization layer. Over all of these metallized structures forming the various ridges is typically an insulative layer of polymeric material known as "solder mask," which is here indicated as 32. Thus, in summary, the structure of the various ridges in the present invention are preferably formed within a metallization layer adjacent a central non-conductive core of the printed wiring board. In a preferred embodiment, these ridges formed in the metallization layer contribute ultimately not less than 1 mil, and preferably about 2 mils, of protrusion above the balance of surface 11 in the finished product. What is important, however, is that the ridges are formed by etching away portions of the metallization layer at surface 11, and so the ridges are essentially available "for free" as they are formed as part of a regular etching process on an existing metallization layer. The board configuration of the present invention is thus useful for the technologies familiarly known as "Ceracom" or "FR-4," or where previously formed and fired ceramic substrates have circuit traces printed on them.

On the side of board 10 having the semiconductor chips mounted thereon, there may be provided, in any known configuration, a quantity of wiring, here indicated as 36, available on the surface as is familiar in printed wiring boards. At least a portion of this wiring 36 forms a landing, here indicated as 38. The landing 38 is simply a portion of the wiring 36 which is available for connection to a contact on a particular semiconductor chip such as 12b. Such a wire bond is shown as 40, and is placed through known wire-bonding techniques such as ultrasonic welding, as is known in the art. According to one embodiment of the present invention, the landings 38 which represent the points which receive one end of a wire bond 40 are all disposed directly opposite a ridge on the opposite side 11 of board 10, in this case a portion of ridge 14 as shown in FIG. 2. The advantage of providing a ridge opposite the surface having the landings 38 is once again to provide a firm surface for wire-bonding equipment when the board 10 is urged against vacuum mount V.

Further shown in FIG. 2 is a conductive via, indicated as 42, which extends from some wiring 36 through the core 30 to a conductive structure which in the illustrated embodiment is indicated as 44, although of course the via 42 could connect to any metallization adjacent surface 11 of board 10. The via 42 may be useful as a ground connection from circuitry 36 to the conductive metallization layers forming the various ridges 14, 20, 44 on surface 11. These metallizations can in turn be connected to ground, such as through conductor 48 indicated in FIG. 1.

The overall design of the board according to the present invention thus facilitates a secure vacuum mount of the board by virtue of the ridge 14 forming a gasket around a slot in a vacuum mounting device. Further, the presence of chip mount ridges 20 directly opposite the location of the chips provide a firm surface for pick-and-place attachment of the chips to board 10, and the presence of a ridge directly opposite the landing such as 38 further provide a firm surface advantageous for the wire-bonding process.

While the invention has been described with reference to the structure disclosed, it is not confined to the details set forth, but is intended to cover such modifications or changes as may come within the scope of the following claims.

I claim:

1. A board, defining a first main side, a second main side, and a thickness therebetween, for supporting at least one semiconductor chip on the first main side thereof, comprising:

a ridge protruding from the second main side, the ridge defining an enclosed surface area on the second main side, the ridge having a thickness of not less than 1 mil relative to the second main side.

2. A board, defining a first main side, a second main side, and a thickness therebetween, for supporting at least one semiconductor chip on the first main side thereof, the board comprising a central non-conductive core, a non-conductive layer generally disposed on the second main side, and a metallization layer disposed between the core and the non-conductive layer, the metallization layer defining a ridge protruding from the second main side, the ridge defining an enclosed surface area on the second main side.

3. The board of claim 2, further comprising a conductive wiring layer adjacent the core toward the first side of the board; and at least one conductive via extending from the metallization layer through the core to the wiring layer.

4. A board, defining a first main side, a second main side, and a thickness therebetween, for supporting at least one semiconductor chip on the first main side thereof, comprising:

a ridge protruding from the second main side, the ridge defining an enclosed surface area on the second main side; and a conductive landing suitable to accept a wirebond on the first main side, the landing being disposed directly opposite a portion of the ridge.

5. An assembly comprising:

a board, defining a first main side, a second main side, and a thickness therebetween;

at least one semiconductor chip attached to the first main side of the board;

a ridge protruding from the second main side of the board, the ridge defining an enclosed surface area on the second main side, the enclosed surface area surrounding a location opposite said at least one semiconductor chip on the first main side, the ridge having a thickness of not less than 1 mil relative to the second main side.

6. An assembly comprising:

a board, defining a first main side, a second main side, and a thickness therebetween, the board comprising a central non-conductive core, a non-conductive layer generally disposed on the second main side, and a metallization layer disposed between the core and the non-conductive layer;

at least one semiconductor chip attached to the first main side of the board; and a ridge protruding from the second main side of the board, the ridge defining an enclosed surface area on the second main side, the enclosed surface area surrounding a location opposite said at least one semiconductor chip on the first main side.

7. The assembly of claim 6, the ridge being defined as part of the metallization layer.

8. The assembly of claim 6, further comprising a conductive wiring layer adjacent the core on the first side of the board; and at least one conductive via extending from the metallization layer through the core to the wiring layer.

9. The assembly of claim 8, the wiring layer defining a landing on the first main side, and the assembly further comprising at least one wire bond extending from the landing to a semiconductor chip, the landing being disposed at a location directly opposite a portion of the ridge on the second main side.

10. A board, defining a first main side, a second main side, and a thickness therebetween, for supporting at least one semiconductor chip on the first main side thereof, comprising:

a ridge protruding from the second main side; and a conductive landing defined on the first main side, the landing accepting a wire bond, the landing disposed at a location directly opposite a portion of the ridge on the second main side.

11. The board of claim 10, the ridge having a thickness of not less than 1 mil relative to the second main side.

12. The board of claim 10, the board comprising at least a central non-conductive core, a non-conductive layer generally disposed on the second main side, and a metallization layer disposed between the core and the non-conductive layer.

13. The board of claim 12, the ridge being defined as part of the metallization layer.

14. The board of claim 12, further comprising a conductive wiring layer adjacent the core on the first side of the board; and at least one conductive via extending from the metallization layer through the core to the wiring layer.

* * * * *